US011049992B2

(12) United States Patent
Lai (10) Patent No.: US 11,049,992 B2
(45) Date of Patent: Jun. 29, 2021

(54) DUAL WAVELENGTH LIGHT EMITTING DEVICE, DUAL WAVELENGTH LIGHT TRANSCEIVING DEVICE AND DISPLAY

(71) Applicant: PixArt Imaging Inc., Hsin-Chu (TW)

(72) Inventor: Hung-Ching Lai, Hsin-Chu (TW)

(73) Assignee: Pix Art Imaging Inc., Hsin-Chu (TW)

( * ) Notice: Subject to any disclaimer, the term of this patent is extended or adjusted under 35 U.S.C. 154(b) by 0 days.

(21) Appl. No.: 16/509,466

(22) Filed: Jul. 11, 2019

(65) Prior Publication Data
US 2021/0013358 A1    Jan. 14, 2021

(51) Int. Cl.
| H01L 31/12 | (2006.01) |
| H01L 27/15 | (2006.01) |
| H01L 33/06 | (2010.01) |
| G06F 3/044 | (2006.01) |
| H01L 33/46 | (2010.01) |
| H01L 31/0352 | (2006.01) |
| G06K 9/00 | (2006.01) |
| H01L 31/173 | (2006.01) |

(52) U.S. Cl.
CPC ............ *H01L 31/125* (2013.01); *G06F 3/044* (2013.01); *G06K 9/00087* (2013.01); *H01L 27/156* (2013.01); *H01L 31/035236* (2013.01); *H01L 31/173* (2013.01); *H01L 33/06* (2013.01); *H01L 33/46* (2013.01)

(58) Field of Classification Search
CPC ....... H01L 31/125; H01L 33/46; H01L 33/06; H01L 31/173; H01L 31/035236; H01L 27/156; G06F 3/044; G06K 9/00087
See application file for complete search history.

(56) References Cited

U.S. PATENT DOCUMENTS

| 2003/0213967 A1* | 11/2003 | Forrest | H01L 27/3209 257/96 |
| 2007/0069220 A1* | 3/2007 | Ogihara | H01L 25/0756 257/79 |
| 2009/0001389 A1* | 1/2009 | Wang | H01L 27/15 257/89 |
| 2009/0128508 A1* | 5/2009 | Sohn | G06F 3/0421 345/173 |
| 2010/0032691 A1* | 2/2010 | Kim | H01L 25/0756 257/88 |
| 2010/0283062 A1* | 11/2010 | Hsieh | H01L 21/6835 257/79 |

(Continued)

FOREIGN PATENT DOCUMENTS

| JP | 2013191705 A | * | 9/2013 |
| WO | WO-2018000935 A1 | * | 1/2018 | ............ G06F 3/044 |

*Primary Examiner* — Bitew A Dinke
(74) *Attorney, Agent, or Firm* — Winston Hsu (57) ABSTRACT

The present invention discloses a dual wavelength light emitting device comprising: a first light emitting device, configured to emit first kind of light; and a second light emitting device, configured to emit second kind of light. The first light emitting device is stacked above the second light emitting device, or stacked below the second light emitting device. The present invention also discloses a dual wavelength light transceiving device which can transmit light and receive light by the same layer. Comparing with a conventional micro LED, the area occupied by the dual wavelength light emitting device or the dual wavelength light transceiving device can be reduced.

12 Claims, 6 Drawing Sheets

(56) References Cited

U.S. PATENT DOCUMENTS

| | | | |
|---|---|---|---|
| 2011/0140132 A1* | 6/2011 | Kang | H01L 25/0756 257/88 |
| 2013/0056785 A1* | 3/2013 | Hwang | H01L 33/385 257/99 |
| 2013/0126921 A1* | 5/2013 | Mohammed | H01L 33/22 257/98 |
| 2014/0252382 A1* | 9/2014 | Hashimoto | H01L 25/0756 257/88 |
| 2016/0342282 A1* | 11/2016 | Wassvik | G02F 1/13338 |
| 2017/0033268 A1* | 2/2017 | Lee | H01L 33/32 |
| 2017/0098736 A1* | 4/2017 | Lee | H01L 33/62 |
| 2017/0365588 A1* | 12/2017 | Chen | H01L 33/62 |
| 2018/0157351 A1* | 6/2018 | Lee | G09G 3/32 |
| 2019/0114458 A1* | 4/2019 | Cho | G09G 3/20 |
| 2019/0157337 A1* | 5/2019 | Lin | H01L 31/16 |
| 2019/0165038 A1* | 5/2019 | Chae | H01L 27/156 |
| 2019/0189049 A1* | 6/2019 | An | G09G 3/32 |
| 2019/0198565 A1* | 6/2019 | Lee | H01L 33/405 |
| 2019/0198709 A1* | 6/2019 | Wildeson | H05B 45/20 |
| 2019/0280039 A1* | 9/2019 | Jia | H01L 27/14692 |
| 2019/0326465 A1* | 10/2019 | Shibata | H01L 31/09 |
| 2020/0110494 A1* | 4/2020 | Chen | G06F 3/044 |
| 2020/0174595 A1* | 6/2020 | Hsiang | G06F 3/04886 |
| 2020/0185567 A1* | 6/2020 | Huang | H01L 33/12 |
| 2020/0212099 A1* | 7/2020 | Tu | H01L 27/153 |

* cited by examiner

DUAL WAVELENGTH LIGHT EMITTING DEVICE, DUAL WAVELENGTH LIGHT TRANSCEIVING DEVICE AND DISPLAY

BACKGROUND OF THE INVENTION

1. Field of the Invention

The present invention relates to a dual wavelength light emitting device, a dual wavelength light transceiving device and a display, and particularly relates to a dual wavelength light emitting device and a dual wavelength light transceiving device can reduce an occupied area, and relates to a display using the devices.

2. Description of the Prior Art

As technology advances, a touch screen can detect a fingerprint without an independent fingerprint region or an independent button becomes popular. Such kind of touch screen may have micro LEDs to emit light to a finger on the touch screen and accordingly detect a fingerprint of the finger based on reflected light of light from micro LEDs. However, such conventional touch screen must include micro LEDs to emit infrared light, and comprise IR receiving diodes independent from the micro LEDs to receive reflected light of the infrared light. Besides, the conventional micro LEDs are provided on locations different from other kinds of pixels such as R, G, B pixels. Therefore, the conventional micro LEDs must occupy an additional area.

SUMMARY OF THE INVENTION

Therefore, one objective of the present is to provide a dual wavelength light transceiving device comprise more than one stacked light emitting device.

Another objective of the present is to provide a dual wavelength light transceiving device which can use the same layer to transmit light and to receive light.

One embodiment of the present invention discloses a dual wavelength light emitting device, comprising: a first light emitting device, configured to emit first kind of light; and a second light emitting device, configured to emit second kind of light. The first light emitting device is stacked above the second light emitting device, or stacked below the second light emitting device.

Another embodiment of the present invention discloses a dual wavelength light transceiving device comprising: a light transceiving layer, configured to emit first kind of light in an emitting mode, and configured to receive reflected light of the first kind of light to generate a sensing signal in a sensing mode; and a light emitting layer, configured to emit second kind of light. The light transceiving layer is stacked above the light emitting layer, or stacked below the light emitting layer.

Still another embodiment of the present invention discloses a display can display an image and can identify a fingerprint or detect a touch of an object, which comprises: at least one dual wavelength light emitting device, comprising: a first light emitting device, configured to emit first kind of light; and a second light emitting device, configured to emit second kind of light. The first light emitting device is stacked above the second light emitting device, or stacked below the second light emitting device.

In view of above-mentioned embodiments, the light emitting devices related with fingerprint or touch detecting and pixels related with displaying images can be stacked together. Further, the light emitting device related with fingerprint detecting can be applied to receive light. Therefore, the area occupied by the light emitting devices related with fingerprint or touch detecting and pixels related with displaying images can be greatly reduced.

These and other objectives of the present invention will no doubt become obvious to those of ordinary skill in the art after reading the following detailed description of the preferred embodiment that is illustrated in the various figures and drawings.

DETAILED DESCRIPTION

In following descriptions, several embodiments are provided in to explain the concept of the present invention. Please note, the terms "first", "second" . . . and other similar terms are only for defining different components, but do not mean to limit the sequence of the components.

The dual wavelength light emitting device according to one embodiment of the present invention provides a dual wavelength light emitting device comprising a first light emitting device and a second light emitting device. The first light emitting device is configured to emit first kind of light, and a second light emitting device is configured to emit second kind of light. The second light emitting device is stacked above the first light emitting device, or stacked below the second light emitting device. In following embodiments, the first kind of light is infrared light and the second light emitting device is an R pixel, thus the second kind of light is red light. However, the first kind of light and the second kind of light are not limited to infrared light and red light. In one embodiment, if the dual wavelength light emitting device provided by the present invention is applied to a display, the second light emitting device is a pixel related with image displaying. For example, the second light emitting device can be an R pixel, a G pixel or a B pixel.

Figure 1:
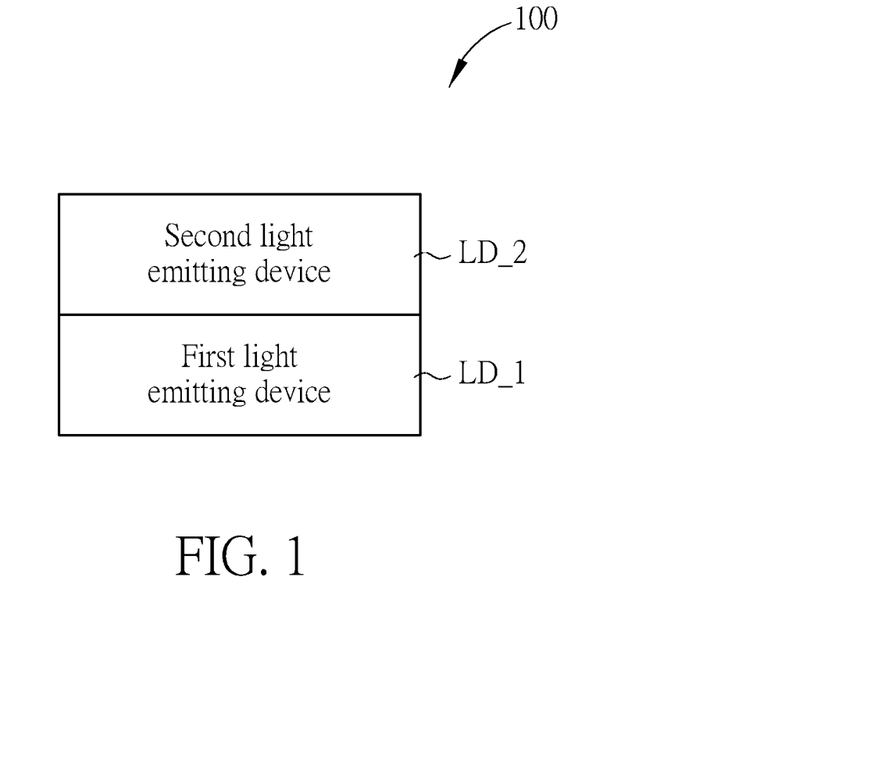
FIG. 1 and FIG. 2 are block diagrams illustrating dual wavelength light emitting devices according to different embodiments of the present invention.
Figure 2:
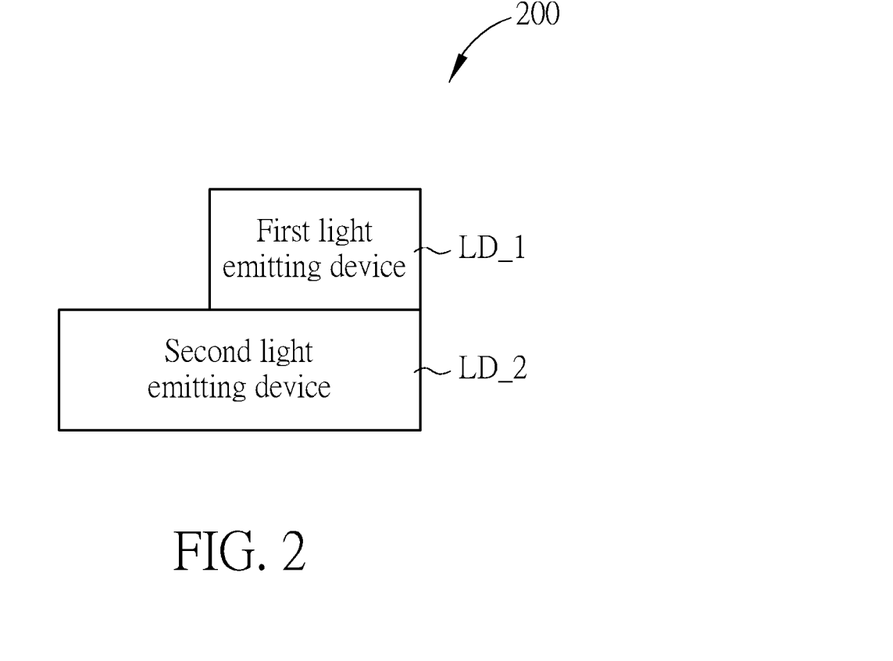

FIG. 1 and FIG. 2 are block diagrams illustrating dual wavelength light emitting devices according to different embodiments of the present invention. Please note FIG. 1 and FIG. 2 are only examples for explaining the concept of the present invention, the structures and the sizes of the first light emitting device LD_1, the second light emitting device LD_2 are not limited to the examples illustrated in FIG. 1 and FIG. 2.

As illustrated in FIG. 1, in the dual wavelength light emitting device 100, the second light emitting device LD_2 is stacked above the first light emitting device LD_1. The second light emitting device LD_2 can cover the entire first light emitting device LD_1 without blocking the infrared light from the first light emitting device LD_1, since infrared light emitted from the first light emitting device LD_1 has long wavelength and therefore can pass through the second light emitting device LD_2. In the embodiment of FIG. 1, the area size of the second light emitting device LD_2 is equal to the area size of the first light emitting device LD_1. However, the area size of the second light emitting device LD_2 can be larger than the area size of the first light emitting device LD_1 while the second light emitting device LD_2 is stacked above the first light emitting device LD_1.

Further, in the dual wavelength light emitting device 200 of FIG. 2, the first emitting device LD_1 is stacked above the second light emitting device LD_2. In such embodiment, the first light emitting device LD_1 covers only partial of the second light emitting device LD_2, since the red light from the second light emitting device LD_2 cannot pass through the first light emitting device LD_1. However, if light emitted from the second light emitting device LD_2 can pass through the first light emitting device LD_1, the first light emitting device LD_1 can cover the entire second light emitting device LD_2.

The dual wavelength light emitting device 100/200 can be provided in a touch screen, which can display images and senses touch control. In such case, the second kind of light L_2 light emitted from the second light emitting device LD_2 is for displaying and the first kind of light L_1 emitted from the first light emitting device LD_1 is for touch sensing. In one embodiment, the light emitting device emitting light for displaying is stacked above the light emitting device emitting light for touch sensing. Therefore, the second light emitting device LD_2 is stacked above the first light emitting device LD_1 to have a better display performance.

Figure 3:
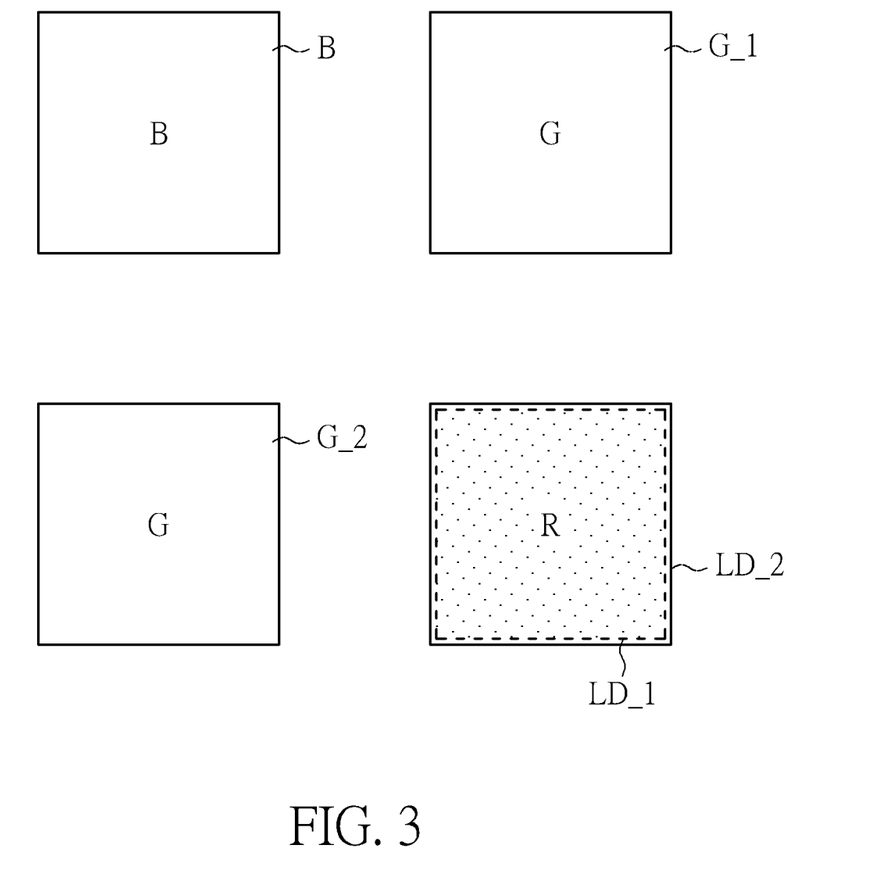
FIG. 3 is a schematic diagram illustrating an arrangement of the dual wavelength light emitting device and other kinds of pixels according to one embodiment of the present invention.

FIG. 3 is a schematic diagram illustrating an arrangement of the dual wavelength light emitting device and other pixels according to one embodiment of the present invention, which corresponds to the embodiment illustrated in FIG. 1. In other words, FIG. 3 is a top view of the embodiment illustrated in FIG. 1. In FIG. 3, the first light emitting device LD_1 is stacked below the second light emitting device LD_2 and shown as dotted points. As above-mentioned, the second light emitting device LD_2 can cover the entire first light emitting device LD_1 without blocking the infrared light from the first light emitting device LD_1, since infrared light from the first light emitting device LD_1 can pass through the second light emitting device LD_2. However, in some cases, partial of the infrared light can pass through the second light emitting device LD_2 but partial of the infrared light is still blocked by the second light emitting device LD_2.

Figure 4:
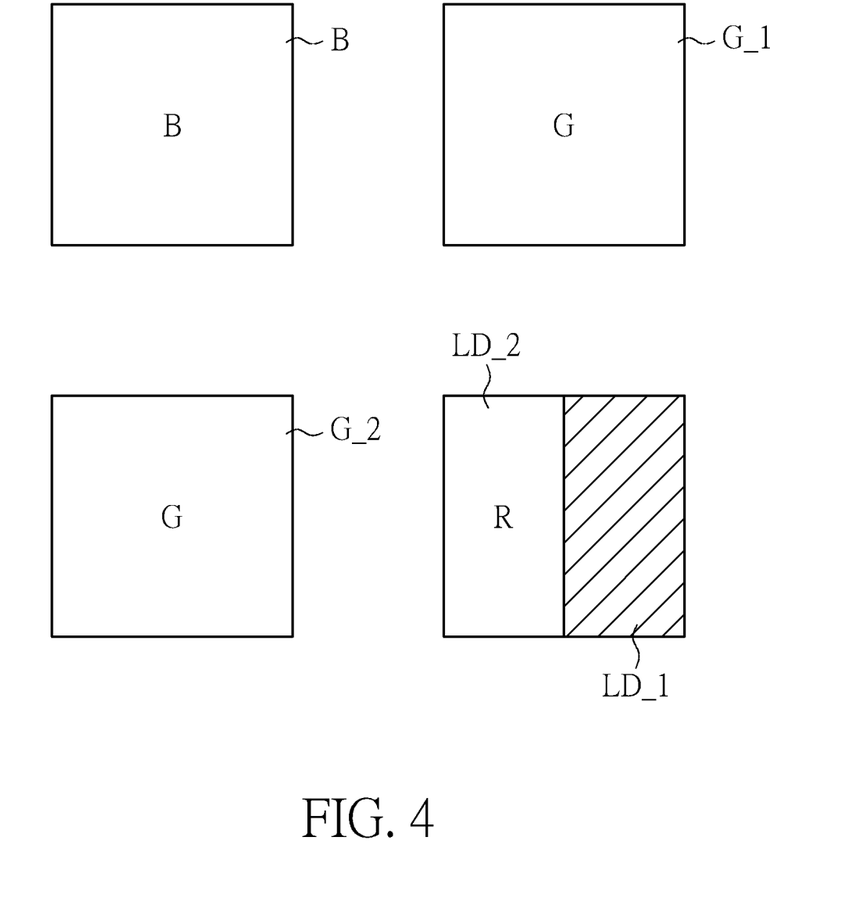
FIG. 4 is a schematic diagram illustrating an arrangement of the dual wavelength light emitting device and other kinds pixels according to another embodiment of the present invention.

FIG. 4 is a schematic diagram illustrating an arrangement of the dual wavelength light emitting device and other pixels according to another embodiment of the present invention, which corresponds to the embodiment illustrated in FIG. 2. In other words, FIG. 4 is a top view of the embodiment illustrated in FIG. 2. In FIG. 4, the first light emitting device LD_1 is stacked above second light emitting device LD_2 and shown as slashed lines. As above-mentioned, the first light emitting device LD_1 covers only partial of the second light emitting device LD_2, since the red light from the second light emitting device LD_2 cannot pass through the first light emitting device LD_1. Please note, the blue pixels B, the green pixels G_1, G_2 in the embodiments of FIG. 3 and FIG. 4 can be replaced by other kinds of pixels.

Via using the above-mentioned stack structure, the area occupied by the dual wavelength light emitting device can be reduced, since it can be stacked above or below other kinds of pixels. Further, The above-mentioned first light emitting device LD_1 not only can operate as an LED to emit light, but also can operate as a diode to receive light. In other words, the first light emitting device LD_1 emits the first kind of light in an emitting mode, and receives reflected light of the first kind of light to generate a sensing signal in a sensing mode. The applications of the dual wavelength light emitting device will be described for more detail below.

Figure 5:
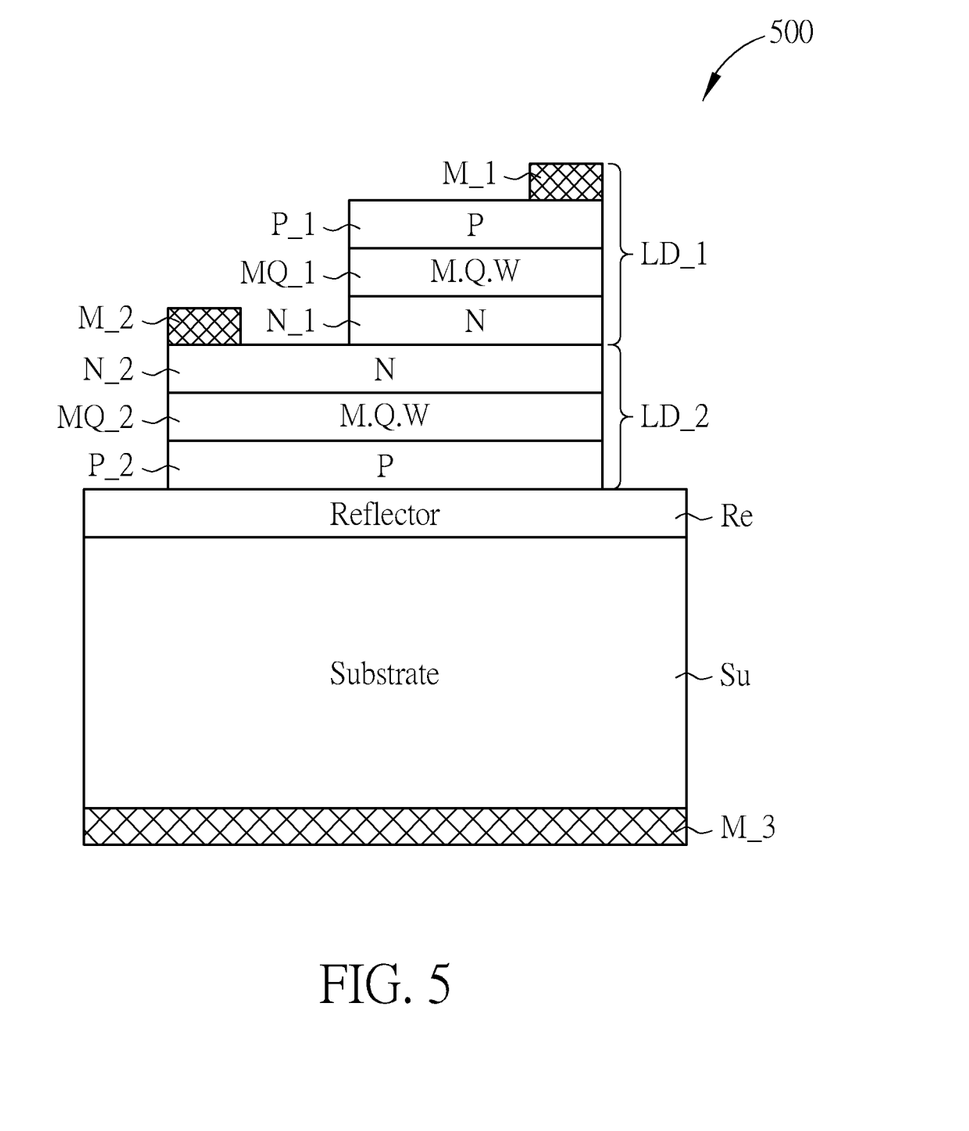
FIG. 5 and FIG. 6 are detail structures of the dual wavelength light emitting devices according to different embodiments of the present invention.
Figure 6:
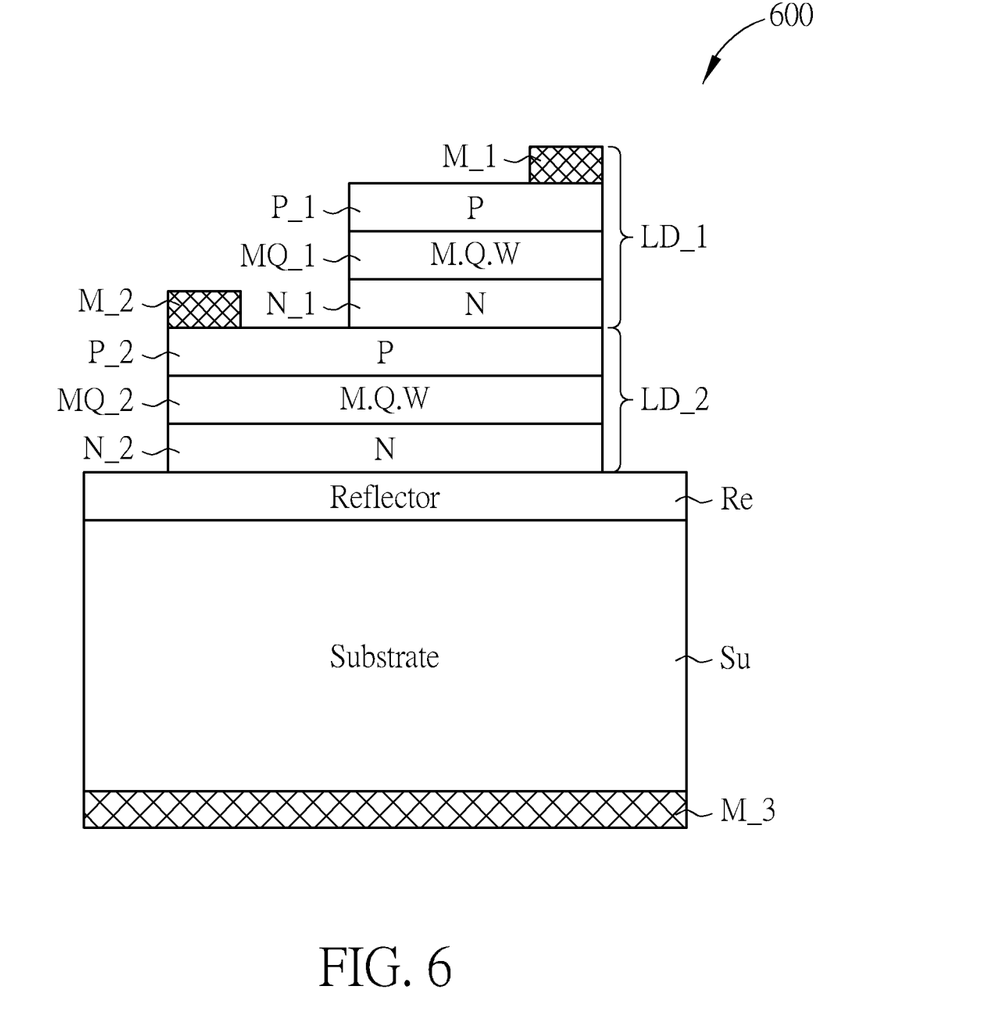

FIG. 5 and FIG. 6 are detail structures of the dual wavelength light emitting devices according to different embodiments of the present invention. Please note, the embodiment in FIG. 2 is taken as an example to explain the embodiments of FIG. 5 and FIG. 6, but the embodiments of FIG. 5 and FIG. 6 can be applied to any other embodiment. As illustrated in FIG. 5, the first light emitting device LD_1 in the dual wavelength light emitting device 500 comprises a first P doped layer (P layer herein after) P_1, a first M.Q.W layer MQ_1, and a first N doped layer (N layer herein after) N_1. Also, the second light emitting device LD_2 in the dual wavelength light emitting device 500 comprises a second N layer N_2, a second M.Q.W layer MQ_2, and a second P layer P_2. An optional reflector Re is provided on the substrate Su. Also, the second P layer P_2, the second M.Q.W layer MQ_2, and the second N layer N_2 are sequentially provided on the reflector Re from bottom to up, and the first N layer N_1, the first M.Q.W layer MQ_1, and the first P layer P_1 are sequentially provided on the second N layer N_2 from bottom to up. In one embodiment, the first N layer N_1 and the second N layer N_2 can be integrated to a single N layer. The wavelength of light emitted from a light emitting device can be decided by the type of ion doped into layers. For example, GaAs or Inp can be doped to the first light emitting device LD_1 such that the first light emitting device LD_1 can emit infrared light. Other details are known by persons skilled in the art, thus are omitted for brevity here.

In the embodiment of FIG. 5, several metal lines M_1, M_2 and M_3 are respectively provided to the first P layer P_1, the second N layer N_2, and the substrate Su as conductive lines. The reflector Re is configured to reflect light from the first light emitting device LD_1 and the second light emitting device LD_2. Also, in one embodiment, the N layer and the P layer can be swapped. That is, the first P layer P_1, the second P layer P_2 can be changed to N layers, and the first N layer N_1, the second N layer N_2 can be changed to P layers.

In the embodiment of FIG. 6, the first light emitting device LD_1 in the dual wavelength light emitting device 600 comprises a first P layer P_1, a first M.Q.W layer MQ_1, and a first N layer N_1. Also, the second light emitting device LD_2 in the dual wavelength light emitting device 600 comprises a second P layer P_2, a second M.Q.W layer MQ_2, and a second N layer N_2. An optional reflector Re is provided on the substrate Su. Also, the second N layer N_2, the second M.Q.W layer MQ_2, and the second P layer P_2 are sequentially provided on the reflector Re from bottom to up, and the first N layer N_1, the first M.Q.W layer MQ_1, and the first P layer P_1 are sequentially provided on the second P layer P_2 from bottom to up.

In the embodiment of FIG. 6, several metal lines M_1, M_2 and M_3 are respectively provided to the first P layer P_1, the second P layer P_2, and the substrate Su as conductive lines. The reflector Re is configured to reflect light from the first light emitting device LD_1 and the second light emitting device LD_2.

In one embodiment, the N layer and the P layer can be swapped. That is, the first P layer P_1, the second P layer P_2 can be changed to N layers, and the first N layer N_1, the second N layer N_2 can be changed to P layers.

In one embodiment, the first light emitting device LD_1 and the second light emitting device LD_2 in FIG. 5 and FIG. 6 can be coupled to a switch, thereby the dual wavelength light emitting device 500 or 600 can operate in three phases. The three phases are: emitting the first kind of light L_1, receiving the first kind of light L_1 and emitting the second kind of light L_2. In one embodiment, the first light emitting device LD_1 emits the first kind of light L_1 while being forward biased and can receive the first kind of light while being reverse biased or not biased. Also, the doping materials or the materials to be doped of the first light emitting device LD_1 can be well selected to reach such function.

Based on the embodiments illustrated in FIG. 5 and FIG. 6, the dual wavelength light emitting device provided by the present invention can transmit light and receive light, and comprise a plurality of layers. Therefore, the dual wavelength light emitting device provided by the present invention can be regarded as a dual wavelength light transceiving device comprising a light transceiving layer and a light emitting layer. The light transceiving layer, such as the first P layer P_1 or the first N layer N_1 in FIG. 5, is configured to emit first kind of light (e.g. IR light) in an emitting mode, and configured to receive reflected light of the first kind of light to generate a sensing signal in a sensing mode. The light emitting layer, such as the second N layer N_2 or the second P layer P_2 in FIG. 5, is configured to emit second kind of light (e.g. red light). The light transceiving layer is stacked above the light emitting layer, or stacked below the light emitting layer.

The above-mentioned dual wavelength light emitting device provided by the present invention can be applied to any device. In one embodiment, it is applied to a display, which can comprise only a displaying function or can comprise the displaying function and a touch control function, such as a touch screen. In following embodiments, the display is a touch screen, but not limited.

Figure 7:
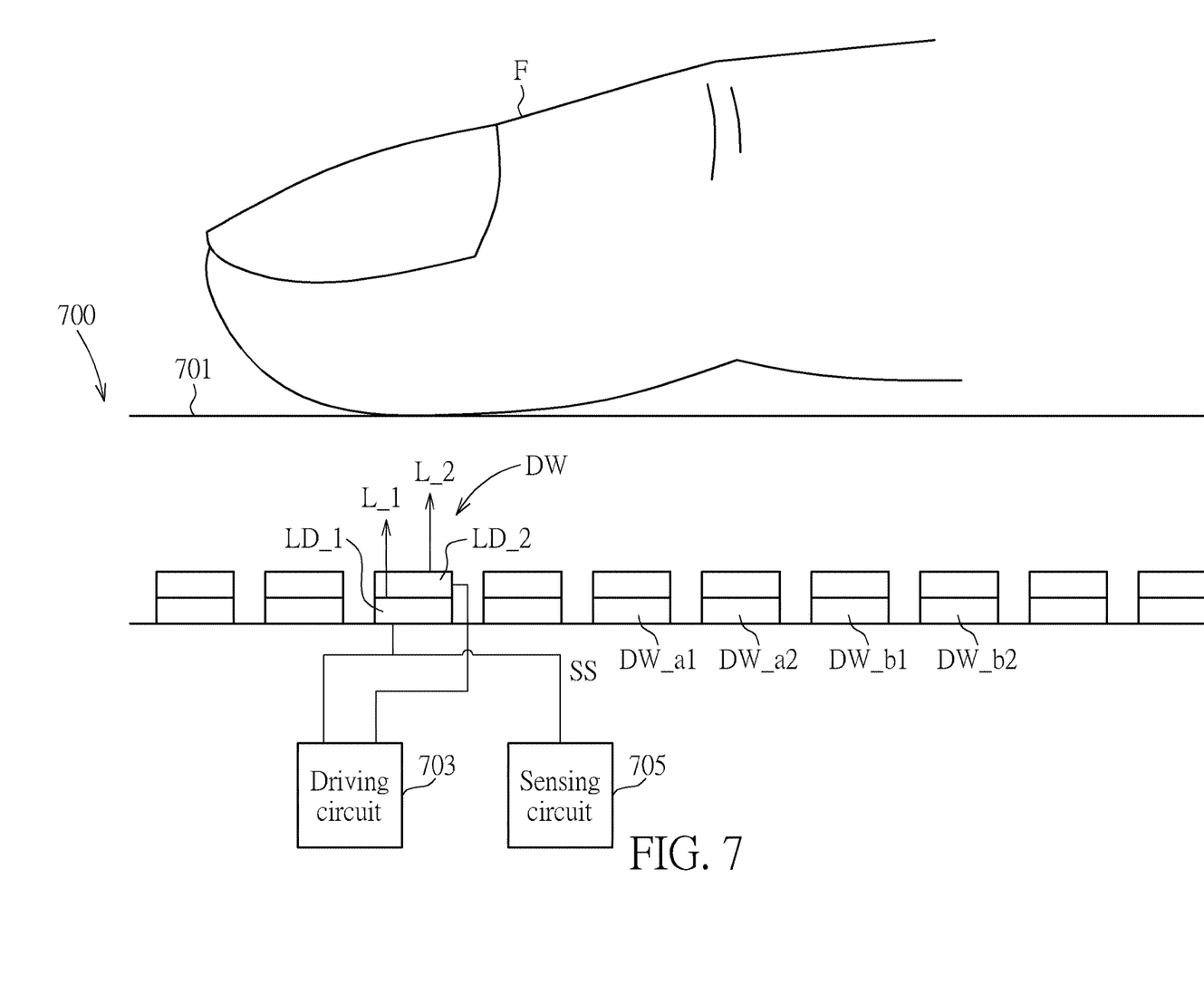
FIG. 7 is a schematic diagram illustrating a case that the dual wavelength light emitting device provided by the present invention is applied to a touch screen.

FIG. 7 is a schematic diagram illustrating a case that the dual wavelength light emitting device provided by the present invention is applied for a touch screen. As illustrated in FIG. 7, the touch screen 700 comprises a touch sensing surface 701 and a plurality of dual wavelength light emitting devices DW, DW_a1, DW_a2, DW_b1, DW_b2. Each of the dual wavelength light emitting devices comprises a first light emitting device LD_1 and a second light emitting device LD_2 (only the dual wavelength light emitting device DW is taken as an example for illustrating). The first light emitting device LD_1 emits the first kind of light L_1 (e.g. IR light) to an object such as the finger F on the touch sensing surface 701 in an emitting mode. Also, the second light emitting device LD_2 emits the second kind of light L_2 responding to an image signal. The touch screen 700 can display an image corresponding to the image signal.

In another embodiment, the touch screen 700 may further includes a plurality of single wavelength light emitting devices arranged with the plurality of dual wavelength light emitting devices to provide light different from the light provided by the dual wavelength light emitting devices.

As illustrated in FIG. 7, the first light emitting device LD_1 and the second light emitting device LD_2 are coupled to a driving circuit 703. The driving circuit 703 can control the emitting operations of the first light emitting device LD_1 and the second light emitting device LD_2. The driving circuit 703 can be, for example, a processor installed with at least one program, or a specific circuit designed for controlling the first light emitting device LD_1 and the second light emitting device LD_2 (e.g. an ASIC). Please note the first light emitting device LD_1 and the second light emitting device LD_2 can be coupled to two independent driving circuits rather than a single driving circuit 703 as illustrated in FIG. 7.

The second light emitting device LD_2 can further couple to a sensing circuit 705 besides the driving circuit 703. The sensing circuit 705 can receive a sensing signal SS (e.g. sensing charges) from the first light emitting device LD_1 in the sensing mode. The sensing circuit 705 can process the sensing signal SS for further processing. The sensing circuit 705 can comprise, for example, analog to digital converters, samplers, comparators, current amplifiers or charge amplifiers. The fingerprint or touch of the finger F can be detected based on the output of the sensing circuit 705. In other words, the sensing signal SS can be regarded as finger identification information or touch information.

In one embodiment, in a single frame period, partial of the dual wavelength light emitting devices initially emit light for displaying (e.g. the red light), and other partial of the dual wavelength light emitting devices emit light for touch sensing simultaneously (e.g. the infrared light). The number of the dual wavelength light emitting devices emit light for touch sensing can be smaller than the number of the dual wavelength light emitting devices emit light for displaying. After an object such as the finger F is determined to touch the touch sensing surface 701 based on the sensing signal SS, more dual wavelength light emitting devices can be applied to emit light for touch sensing. By this way, the power consumption can be reduced while no object touches the touch sensing surface 701, and the accuracy of touch sensing can increase since more dual wavelength light emitting devices emit the light for touch sensing.

In one embodiment, the dual wavelength light emitting devices in the touch screen or the display are classified to a plurality of regions. For example, the dual wavelength light emitting devices are classified to N*M rectangles. Each region has one dual wavelength light emitting device for touch sensing and at least one dual wavelength light emitting device for displaying. If the finger is detected via one or more dual wavelength light emitting device, all dual wavelength light emitting devices in a corresponding region can be applied for touch sensing. The corresponding region can be the region in which the dual wavelength light emitting device for touch sensing is provided or a region neighboring to the region in which the dual wavelength light emitting device for touch sensing is provided.

Take FIG. 7 for example, the dual wavelength light emitting devices DW_a1 and DW_a2 are provided in a first region and the dual wavelength light emitting devices DW_b1 and DW_b2 are provided in a second region neighboring to the first region. Also, the dual wavelength light emitting devices DW_a1 and DW_b1 are applied for touch sensing and the dual wavelength light emitting devices DW_a2 and DW_b2 are applied for displaying. The dual wavelength light emitting devices DW_a2 or the dual wavelength light emitting devices DW_b2 can be changed for touch sensing if the finger is detected via the dual wavelength light emitting devices DW_a1 or the dual wavelength light emitting devices DW_b1.

Please refer to FIG. 3 again, if the embodiment of FIG. 3 is applied to FIG. 7, the blue pixel B, the green pixels G_1, G_2, and the pixel comprising the first light emitting device LD_1 and the second light emitting device LD_1 are arranged to display the image. The pixel comprising the first light emitting device LD_1 and the second light emitting device LD_1 is a dual wave length light emitting device and the blue pixel B, the green pixels G_1, G_2 are single wavelength light emitting devices. The dual wavelength light emitting device is configured to emit the above-mentioned first kind of light L_1, receive the first kind of light L_1 (i.e. receiving reflected light generated according to the first kind of light L_1) and emit the second kind of light L_2 in three different phases. The single wavelength light emitting device is used to emit third kind of light, such as the blue light or the green light. The second kind of light and the third kind of light are emitted simultaneously to display the image.

In one embodiment, the single wavelength light emitting device does not emit the third kind of light when the dual wavelength light emitting device receives the first kind of light. Please note, the pixel for displaying can comprise another number of single wavelength light emitting device rather than three single wavelength light emitting devices illustrated in FIG. 3.

In view of above-mentioned embodiments, the light emitting devices related with fingerprint or touch detecting and pixels related with displaying images can be stacked together. Further, the light emitting device related with fingerprint detecting can be applied to receive light. Therefore, the area occupied by the light emitting devices related with fingerprint or touch detecting and pixels related with displaying images can be greatly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A display can display an image and can identify a fingerprint or detect a touch of an object, comprising:
   a plurality of pixels arranged to display the image, wherein the plurality of pixels include at least one of the plurality of pixels is a dual wavelength light emitting device and at least one of the plurality of pixel is a single wavelength light emitting device;
   wherein the dual wavelength light emitting device is configured to emit first kind of light, receive reflected light of the first kind of light and emit second kind of light in three different phases;
   wherein the single wavelength light emitting device is used to emit a third kind of light; and
   wherein the second kind of light and the third kind of light are emitted simultaneously to display the image;
   wherein the dual wavelength light emitting device receives the reflected light to generate a sensing signal for detecting the touch of the object.

2. The display of claim 1, wherein the single wavelength light emitting device does not emit the third kind of light when the dual wavelength light emitting device receives the first kind of light.

3. The display of claim 1, wherein the plurality of pixels comprises a pixel operating as the single wavelength light emitting device for emitting green light and a pixel operating as the single wavelength light emitting device for emitting blue light.

4. The display of claim 1, wherein the dual wavelength light emitting device, comprises:
   a first light emitting device, configured to emit first kind of light; and
   a second light emitting device, configured to emit second kind of light;
   wherein the first light emitting device is stacked above the second light emitting device, or stacked below the second light emitting device.

5. The display of claim 4, wherein the first light emitting device is stacked above the second light emitting device, and the first light emitting device covers only partial of the second light emitting device.

6. The display of claim 4, wherein the second light emitting device is stacked above the first light emitting device, and the second light emitting device covers entire the first light emitting device.

7. The display of claim 4, wherein the first light emitting device comprises a first N layer, a first P layer and a first MQW layer, and the second light emitting device comprises a second N layer, a second P layer and a second MQW layer.

8. The display of claim 7, wherein the first N layer is incorporated with the second N layer, or the first P layer is incorporated with the second P layer.

9. The display of claim 4, wherein the first kind of light is infrared light and the second light emitting device is a pixel.

10. The display of claim 9, wherein the second kind of light is red light.

11. The display of claim 9, wherein the first light emitting device emits the first kind of light in an emitting mode, and receives reflected light of the first kind of light to generate sensing charges as fingerprint identification information or touch information in a sensing mode.

12. The display of claim 9, comprising a plurality of the dual wavelength light emitting devices;
   wherein a partial of the dual wavelength light emitting devices initially emit the second kind of light, and another partial of the dual wavelength light emitting devices emit the first kind of light simultaneously;
   wherein more dual wavelength light emitting devices are applied to emit light for touch sensing after a finger is determined to touch the display based on the sensing charges.

* * * * *